(12) United States Patent
Colla

(10) Patent No.: US 12,275,232 B1
(45) Date of Patent: Apr. 15, 2025

(54) METHOD OF DISPENSING PASTE FOR A PRINTER USING A PASTE DISPENSING APPARATUS AND PASTE DISPENSING APPARATUS FOR DISPENSING PASTE FOR A PRINTER

(71) Applicant: APPLIED MATERIALS ITALIA S.R.L., San Biagio di Callalta (IT)

(72) Inventor: Davide Colla, Treviso (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 0 days.

(21) Appl. No.: 18/845,233

(22) PCT Filed: Mar. 8, 2022

(86) PCT No.: PCT/EP2022/055896
§ 371 (c)(1),
(2) Date: Sep. 9, 2024

(87) PCT Pub. No.: WO2023/169661
PCT Pub. Date: Sep. 14, 2023

(51) Int. Cl.
*B41F 15/08* (2006.01)
*B41F 15/40* (2006.01)
(Continued)

(52) U.S. Cl.
CPC .......... *B41F 15/0881* (2013.01); *B41F 15/40* (2013.01); *H05K 1/092* (2013.01);
(Continued)

(58) Field of Classification Search
CPC ..... B41F 15/0881; B41F 15/40; H05K 1/092; H05K 1/1216
See application file for complete search history.

(56) References Cited

U.S. PATENT DOCUMENTS 8,807,026 B2 * 8/2014 Bettinelli ............. H05K 3/1216
101/115
11,379,639 B2 * 7/2022 Lee ....................... H05K 3/1216
(Continued)

FOREIGN PATENT DOCUMENTS

EP        0514770 A1    11/1992

OTHER PUBLICATIONS

International Search Report for International Application No. PCT/EP2022/055896 dated Jul. 11, 2022.

*Primary Examiner* — Jeremy Carroll
(74) *Attorney, Agent, or Firm* — Patterson + Sheridan, LLP

(57) ABSTRACT

A method of dispensing paste for a printer using a paste dispensing apparatus is provided. The paste dispensing apparatus includes a reservoir for storing a paste for a printer. The reservoir includes a stirrer for stirring the paste. The paste dispensing apparatus includes a receptacle for receiving paste from the reservoir. The paste dispensing apparatus includes a closable passage from the reservoir to the receptacle. The closable passage is changeable between an open state and a closed state. In the open state, the receptacle is fluidly coupled to the reservoir so that paste can pass from the reservoir to the receptacle. In the closed state, the receptacle is fluidly decoupled from the reservoir so that the paste is prevented from passing from the reservoir to the receptacle. The paste dispensing apparatus includes a pusher for pushing paste out of the receptacle. The method includes transferring a first volume of paste from the reservoir to the receptacle while the closable passage is in the open state. The method includes, after the transferring, changing the closable passage from the open state to the closed state. The method includes, after the changing, performing a first discharging operation by the pusher to discharge a first (Continued)

amount of paste from the receptacle while the closable passage is in the closed state.

15 Claims, 10 Drawing Sheets

(51) Int. Cl.
  *H05K 1/09* (2006.01)
  *H05K 3/12* (2006.01)
(52) U.S. Cl.
  CPC ........ *H05K 3/1216* (2013.01); *B41P 2215/50* (2013.01); *H05K 2203/0126* (2013.01)

(56) References Cited

U.S. PATENT DOCUMENTS

| | | |
|---|---|---|
| 2009/0294483 A1 | 12/2009 | Kim |
| 2018/0338378 A1* | 11/2018 | Hawkins ............. B41F 15/0881 |
| 2020/0391315 A1 | 12/2020 | Lynch et al. |
| 2021/0060925 A1* | 3/2021 | Colla ................... H05K 3/1216 |

* cited by examiner

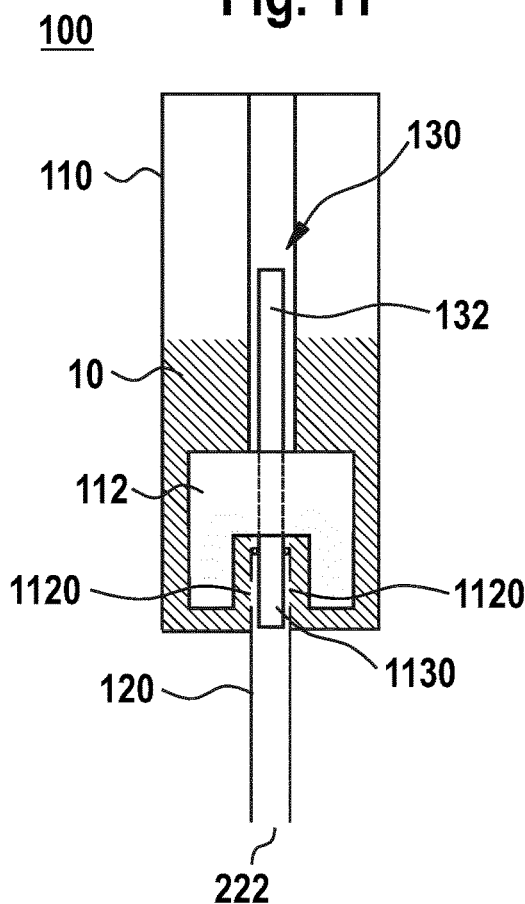
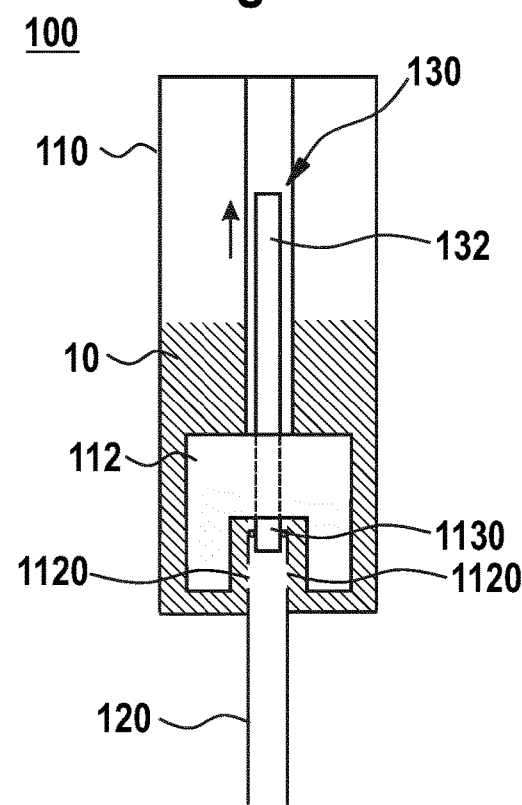

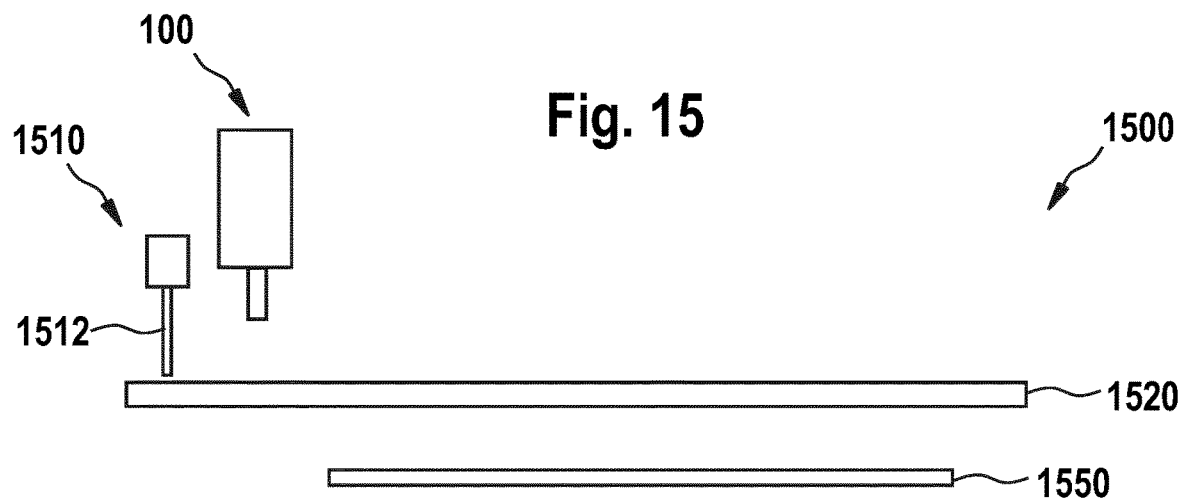
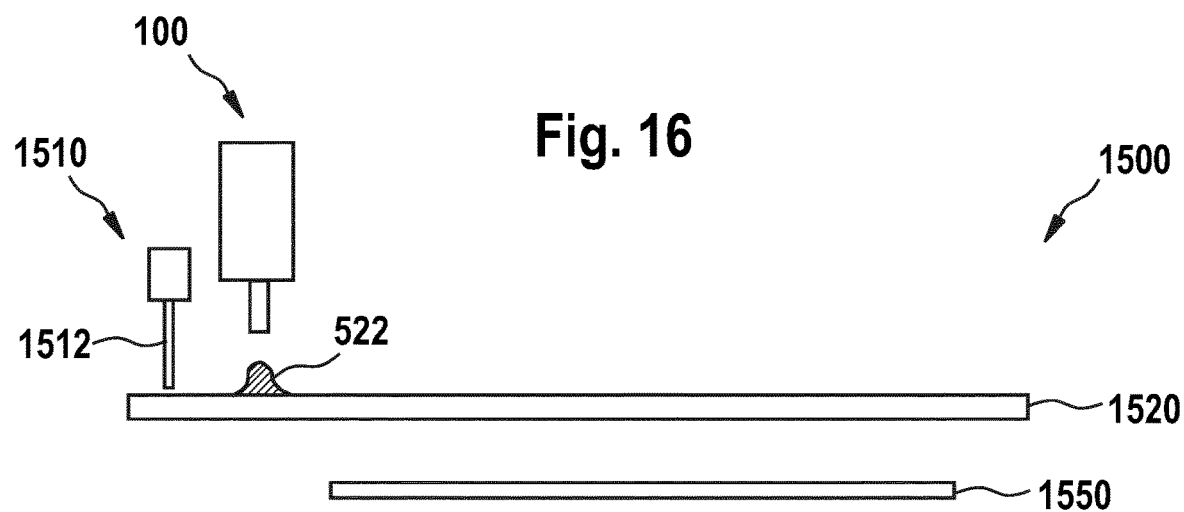
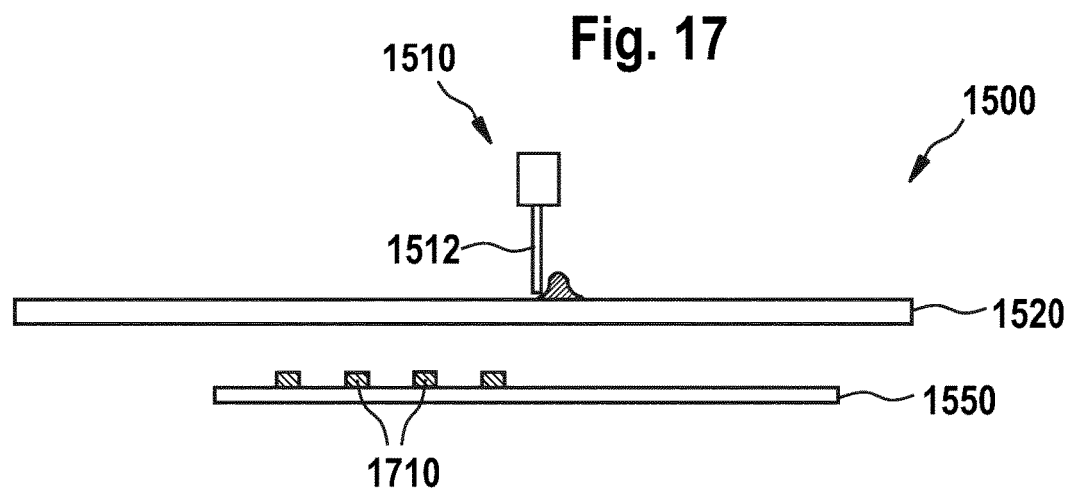

METHOD OF DISPENSING PASTE FOR A PRINTER USING A PASTE DISPENSING APPARATUS AND PASTE DISPENSING APPARATUS FOR DISPENSING PASTE FOR A PRINTER

FIELD

Embodiments described herein relate to a method and an apparatus for dispensing a paste for a printer. The paste can be a conductive paste, such as a silver paste, used for printing a conductive pattern on a semiconductor substrate, such as a solar cell or a substrate used for the manufacture of a solar cell. More specifically, embodiments described herein relate to a method and apparatus for supplying a printing paste to a screen printer, wherein the screen printer is used for printing a pattern of busbars and/or fingers on a solar cell or a substrate used for the manufacture of a solar cell.

BACKGROUND

Solar cells, or photovoltaic cells, are devices that convert sunlight into electrical power. A solar cell includes a substrate or wafer, for example a silicon wafer. Patterns of conductive material can be formed on the substrate. For example, a solar cell can include a set of fingers that are formed on the substrate. The fingers can be a plurality of parallel lines made of a conductive material, such as silver. A solar cell can include set of busbars that are also formed on the substrate. The busbars can likewise be a plurality of parallel lines made of a conductive material such as silver. The fingers and busbars are electrically connected to each other.

The current generated by the solar cell may be collected by the fingers and may subsequently be transferred from the fingers to the busbars. The busbars may be connected to an external device so that the electrical current can be transported from the busbars to the external device.

For manufacturing a solar cell, the conductive patterns such as the fingers and busbars are deposited on the substrate in a deposition process. For example, screen printing may be used for printing the busbars and fingers on a substrate. In screen printing, a printing paste, such as a silver paste, is urged to a screen having a pattern of openings corresponding to the shape of the conductive pattern that is to be printed on the substrate.

During production, the printer is regularly supplied with a new dose of printing paste when the previous dose has been used up. In many cases, each fresh dose of printing paste is supplied manually to the printer. Yet, such a manual supply of printing paste is work-intensive, so there is a need for automated systems for feeding the printing paste to the printer. Further, some automated systems for dispensing the printing paste as known in the art have the drawback that the paste delivered by such a system is often of non-optimal quality. The non-optimal quality of the paste can be caused by the manner in which the paste is stored in the paste dispensing system. As the paste is stored by and travels through the paste dispensing system, the initial quality of the paste may deteriorate and the paste that is ultimately supplied to the printer may have inferior properties.

In light of the above, there is a need for improved methods and apparatuses for dispensing a printing paste.

SUMMARY

According to an embodiment, a method of dispensing paste for a printer using a paste dispensing apparatus is provided. The paste dispensing apparatus includes a reservoir for storing a paste for a printer. The reservoir includes a stirrer for stirring the paste. The paste dispensing apparatus includes a receptacle for receiving paste from the reservoir. The paste dispensing apparatus includes a closable passage from the reservoir to the receptacle. The closable passage is changeable between an open state and a closed state. In the open state, the receptacle is fluidly coupled to the reservoir so that paste can pass from the reservoir to the receptacle. In the closed state, the receptacle is fluidly decoupled from the reservoir so that the paste is prevented from passing from the reservoir to the receptacle. The paste dispensing apparatus includes a pusher for pushing paste out of the receptacle. The method includes transferring a first volume of paste from the reservoir to the receptacle while the closable passage is in the open state. The method includes, after the transferring, changing the closable passage from the open state to the closed state. The method includes, after the changing, performing a first discharging operation by the pusher to discharge a first amount of paste from the receptacle while the closable passage is in the closed state.

According to a further embodiment, a paste dispensing apparatus for dispensing paste for a printer is provided. The paste dispensing apparatus includes a reservoir for storing a paste for a printer. The reservoir includes a stirrer for stirring the paste. The paste dispensing apparatus includes a receptacle for receiving paste from the reservoir. The paste dispensing apparatus includes a closable passage from the reservoir to the receptacle. The closable passage is changeable between an open state and a closed state. In the open state, the receptacle is fluidly coupled to the reservoir so that the paste can pass from the reservoir to the receptacle. In the closed state, the receptacle is fluidly decoupled from the reservoir so that the paste is prevented from passing from the reservoir to the receptacle. The paste dispensing apparatus includes a pusher for discharging paste from the receptacle. The paste dispensing apparatus is configured to perform a first discharging operation by the pusher to discharge a first amount of paste from the receptacle while the closable passage is in the closed state.

According to a further embodiment, a paste dispensing apparatus for dispensing a paste for a printer is provided. The paste dispensing apparatus includes a reservoir including a stirrer. The paste dispensing apparatus includes a receptacle. The paste dispensing apparatus includes a pusher. The receptacle is movable with respect to the reservoir between a first position and a second position. In the first position, the receptacle is fluidly coupled or couplable to the reservoir. In the second position, the receptacle is arranged to be acted upon by the pusher.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

A full and enabling disclosure to one of ordinary skill in the art is set forth more particularly in the remainder of the specification including reference to the accompanying drawings wherein:

FIG. 11 shows a paste dispensing apparatus for dispensing a paste for a printer according to embodiments described herein;

FIG. 12 shows a discharging rod in a retracted position in a paste dispensing apparatus according to embodiments described herein;

FIGS. 15-17 illustrate the supplying of paste to a printer using a paste dispensing apparatus according to embodiments described herein;

DETAILED DESCRIPTION

Figure 1:
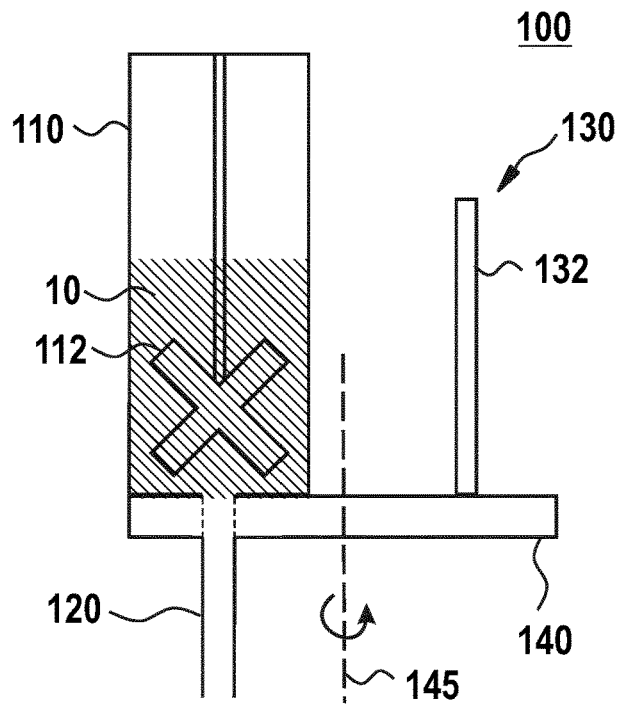
FIG. 1 shows a paste dispensing apparatus for dispensing a paste for a printer according to embodiments described herein in a side view.

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

The drawings are schematic drawings which are not drawn to scale. Some elements in the drawings may have dimensions which are exaggerated for the purpose of highlighting aspects of the present disclosure and/or for the sake of clarity of presentation.

FIG. 1 shows a paste dispensing apparatus 100 for dispensing a paste 10 for a printer according to embodiments described herein. The paste dispensing apparatus 100 includes a reservoir 110, or tank. A stirrer 112 for stirring the paste 10 may be provided in the reservoir 110. A stirrer can be a device configured for maintaining a desired shear rate, or rheological state, of the paste 10 in the reservoir 110. The stirrer 112 may be movable, e.g. rotatable, for stirring the paste 10. The stirrer 112 may be arranged to stir a volume of paste in the reservoir 110. The stirrer 112 may include a stirring plate that is attached to a rotatable shaft. The stirring plate may be configured to contact the paste 10 in the reservoir 110. Rotation of the stirring plate may result in a stirring of the paste 10. Due to the presence of the stirrer 112 in the reservoir 110, the paste 10 in the reservoir 110 can be continuously stirred so that the paste 10 can be maintained at a target rheological state, in other words the paste 10 in the reservoir 110 can be maintained at high quality for printing.

A paste as described herein, such as the paste 10, can be understood as a paste for printing, or printing paste. The paste may be a paste for screen printing. The paste may be a conductive paste, an adhesive paste, or a paste that is both conductive and adhesive. The paste may, for example, be a silver paste. The paste, for example a conductive paste, may be configured for printing a conductive pattern on a substrate used for the manufacture of a solar cell, such a pattern including a plurality of fingers and/or busbars. In another example, the paste can be an adhesive paste configured for printing an adhesive on a solar cell. The adhesive may be configured for connecting the solar cell to another solar cell, for example in a shingled solar cell arrangement including a plurality of partially overlapping solar cells. In other embodiments, the paste may be configured for printing one or more features on a semiconductor substrate and/or a substrate used for the manufacture of an electronic device.

The paste dispensing apparatus 100 includes a receptacle 120 configured to receive paste from the reservoir 110. The receptacle 120 may be much smaller than the reservoir 110. The receptacle 120 may be a tube-shaped receptacle, for example a pipe. The receptacle, such as a pipe, may have openings on opposite ends of the receptacle that may be configured for letting the paste pass there-through.

The paste dispensing apparatus 100 includes a discharging mechanism 130. The discharging mechanism 130 includes a pusher 132, such as a discharging rod. The pusher 132 is configured for pushing paste out of the receptacle 120. The pusher 132 may be movable in a direction defined by a length of the receptacle 120. The pusher 132 shown in FIG. 1 may be movable in an up-down direction. The discharging mechanism 130 may include an actuator or set of actuators, such as one or more linear motion actuators (e.g. including a torque motor coupled to a screw mechanism), connected to the pusher 132 for moving the pusher 132 to push paste out of the receptacle 120.

The paste dispensing apparatus 100 may include a movable support 140. The receptacle 120 may be mountable to, mounted to, or supported by, the movable support 140. The receptacle 120 may be detachably mounted to the movable support 140. The reservoir 110 and/or the pusher 132 may be arranged adjacent to, more specifically in contact or near-contact with, the movable support 140.

As shown in FIG. 1, the movable support 140 may be a rotary support. The rotary support may be movable over an angle about a rotation axis 145 of the rotary support. A rotation of the rotary support may be caused by an actuator, such as a motor or a pneumatic actuator. The rotation axis 145 may extend in a length direction of the receptacle 120. The rotation axis 145 may extend through a portion, such as a center portion, of the rotary support. The receptacle 120 may move, or rotate, together with the rotary support. The movement of the rotary support about the rotation axis 145 causes a movement of the receptacle 120 about the rotation axis 145. The movement of the rotary support and/or of the receptacle 120 about the rotation axis 145 may be a movement relative to the reservoir 110 and/or relative to the pusher 132. The reservoir 110 may not rotate together with the rotary support. The pusher 132 may not rotate together with the rotary support.

Figure 2:
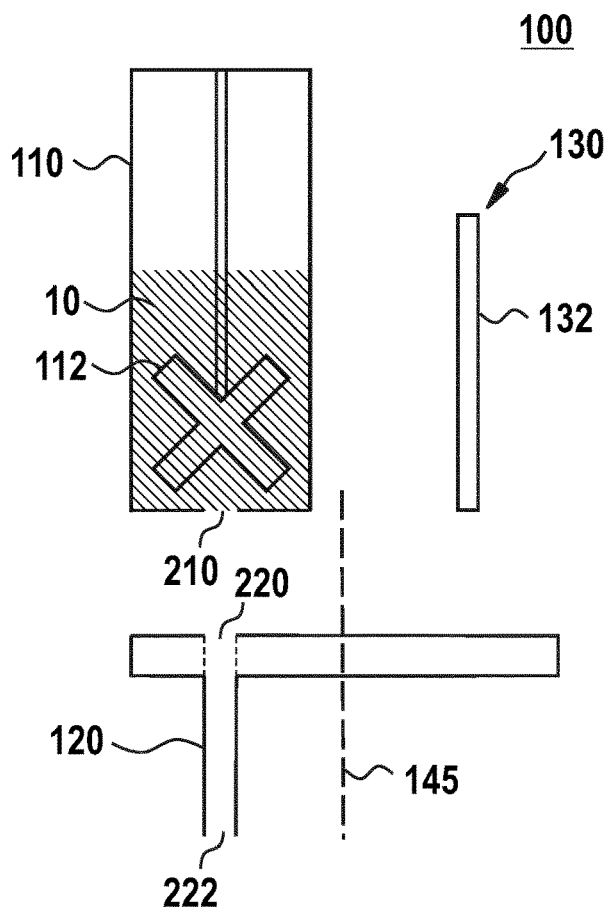
FIG. 2 shows a paste dispensing apparatus for dispensing a paste for a printer according to embodiments described herein, in an exploded view.

FIG. 2 shows a paste dispensing apparatus 100 according to embodiments described herein in an exploded view for highlighting further aspects. The reservoir 110 may include one or more outlet openings 210 for allowing the paste 10 to exit the reservoir 110. The one or more outlet openings 210 may face the movable support 140. The receptacle 120 may include one or more inlet openings 220 for receiving paste. In a first position of the receptacle 120, the one or more inlet openings 220 may be aligned with, or face, the one or more outlet openings 210, so that paste 10 can pass from the reservoir 110 to the receptacle 120 via the one or more outlet openings 210 of the reservoir 110 and the one or more inlet openings 220 of the receptacle 120. The aligned configuration of the one or more outlet openings 210 and the one or more inlet openings 220 may provide a passage through which the paste 10 can flow from the reservoir 110 to the receptacle 120.

The receptacle 120 may include one or more discharge openings 222. The paste can be discharged, or ejected or expelled, from the receptacle 120 at the one or more discharge openings 222. The paste may enter the receptacle 120 at the one or more inlet openings 220. The one or more discharge openings 222 and the one or more inlet openings 220 may be on opposite ends of the receptacle 120. The paste may move through the receptacle, e.g. a tubular receptacle from the one or more inlet openings 220 to the one or more discharge openings 222. The paste may exit the receptacle 120 at the one or more discharge openings 222.

The reservoir 110 and at least a portion of the receptacle 120, such as the one or more discharge openings 222 of the receptacle 120, may be on opposite sides of the movable support 140.

Figure 3:
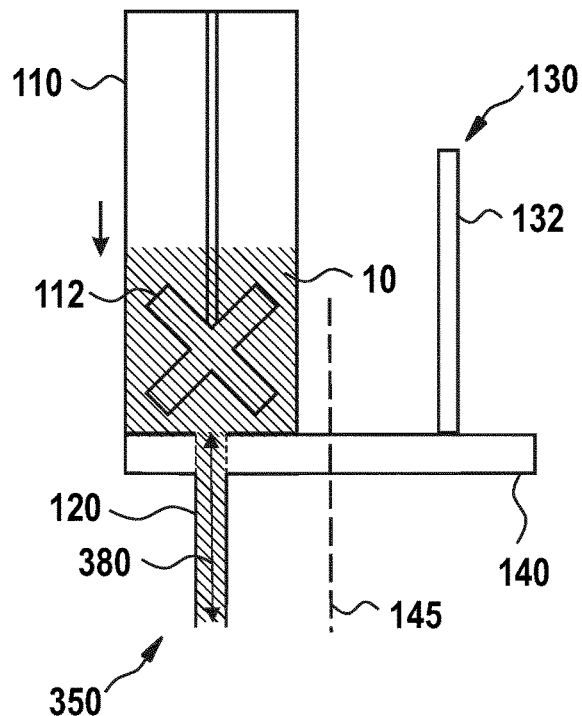
FIG. 3 shows a transfer of a first volume of paste from a reservoir to a receptacle of a paste dispensing apparatus according to embodiments described herein.

FIG. 3 shows the paste dispensing apparatus 100 according to embodiments described herein. The receptacle 120 in FIG. 3 is in a first position 350 relative to the reservoir 110. In the first position 350, the one or more inlet openings 220 of the receptacle 120 may be aligned with, or face, the one or more outlet openings 210. In the first position 350, by virtue of the alignment of the one or more outlet openings 210 and the one or more inlet openings 220, the reservoir 110 may be fluidly coupled, or fluidly connected, to the receptacle 120 so that paste can flow from the reservoir 110 to the receptacle 120. A first volume of paste 380 may be transferred from the reservoir 110 to the receptacle 120 via the one or more outlet openings 210 and the one or more inlet openings 220. For example, the paste dispensing apparatus 100 may include a pusher, e.g. a piston (not shown), disposed in the reservoir 110. The pusher in the reservoir 110 may be configured for pushing the paste 10 downward so that the first volume of paste 380 is transferred from the reservoir 110 to the receptacle 120. The extent of the first volume of paste 380 is indicated in FIG. 3 by the arrow at 380.

The first volume of paste 380 (and likewise the second volume of paste as described below) may correspond to a maximum amount of paste that the receptacle 120 is configured to contain. After the first volume of paste (or second volume of paste) has been transferred from the reservoir 110 to the receptacle 120, the receptacle may be filled with paste, as illustrated in FIG. 3.

In the first position 350 of the receptacle 120, the receptacle 120 may be adjacent to the reservoir 110 so that the paste 10 can pass directly from the reservoir 110 to the receptacle 120. Specifically, the one or more inlet openings 220 of the receptacle 120 may be adjacent to the one or more outlet openings 210 of the reservoir 110. That the receptacle 120 is "adjacent" to the reservoir 110 can be understood in the sense that paste exiting the reservoir can directly enter the receptacle without having to traverse a length of tube or other channel separating the receptacle from the reservoir. Particularly, between the reservoir and the receptacle, there may be no channel for the paste that is inaccessible to the pusher 132 of the discharging mechanism 130. If such a channel were to be present, then the paste inside the channel would not be accessible for discharging, and would be subject to drying or hardening, resulting in a decreased quality of the paste.

While the receptacle 120 is in the first position 350, the pusher 132 and at least a portion of the receptacle 120, such as the one or more discharge openings 222, may be on opposite sides of the movable support 140. While the receptacle 120 is in the first position 350, the reservoir 110 and the pusher 132 may be on a same side of the movable support 140 (e.g. the upper side of the movable support in FIG. 3).

Figure 4:
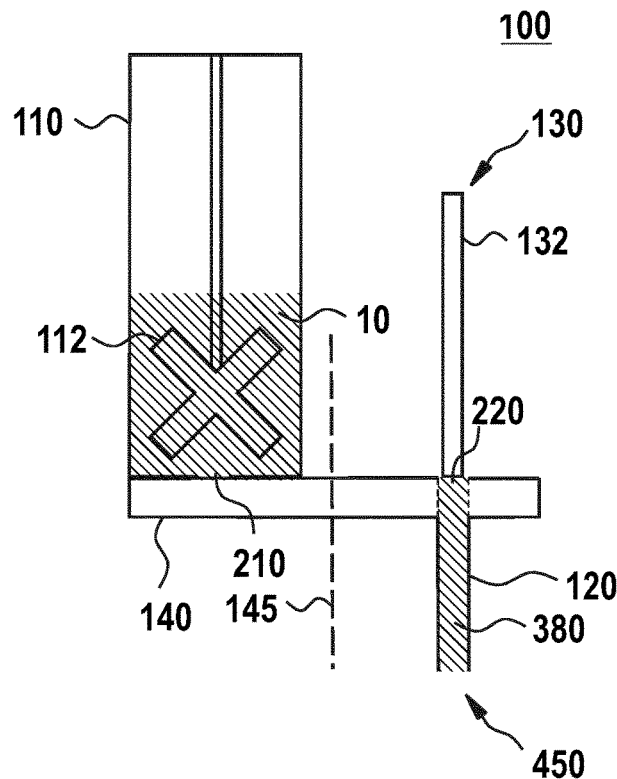
FIG. 4 shows a rotation of the receptacle from a first position to a second position in a paste dispensing apparatus according to embodiments described herein.

After the first volume of paste 380 has been transferred into the receptacle 120, the receptacle 120 including the first volume of paste 380 may be moved from the first position 350 to a second position 450 by a movement of the movable support 140. For example, as illustrated in FIG. 4, the movable support 140 may be a rotary support, and the receptacle 120 including the first volume of paste 380 may be moved from the first position 350 to the second position 450 by a rotation of the rotary support with respect to the rotation axis 145.

During the movement of the receptacle 120 from the first position 350 to the second position 450, the reservoir 110 and/or the pusher 132 may be stationary. The receptacle 120 may move from a first position adjacent to the reservoir 110 to a second position adjacent to the pusher 132.

In the second position 450, the one or more inlet openings 220 of the receptacle 120 and the one or more outlet openings 210 of the reservoir 110 may be spaced apart, or offset, from each other in a radial direction (e.g. a direction perpendicular to rotation axis 145). In the second position 450, the one or more inlet openings 220 and the one or more outlet openings 210 may not be aligned with each other. In the second position 450, the reservoir 110 and the receptacle 120 may be fluidly decoupled from each other.

In the second position 450, a portion of the movable support 140 may block, or seal, the one or more outlet openings 210 of the reservoir 110. The one or more outlet openings 210 may be closed. The paste 10 is prevented from exiting the reservoir 110. A drying or hardening of the paste at the one or more outlet openings 210 may be prevented. The paste 10 in the reservoir 110 can be maintained at high quality.

In light of the above, the one or more inlet openings 220 of the receptacle 120 and the one or more outlet openings 210 of the reservoir 110 may provide a closable passage from the reservoir 110 to the receptacle 120. When the receptacle is in the first position 350, the one or more inlet openings 220 and the one or more outlet openings 210 may be aligned with each other, allowing paste to pass from the reservoir 110 to the receptacle 120. The closable passage may be in an open state. When the receptacle is in the second position 450, the one or more inlet openings 220 and the one or more outlet openings 210 may be offset with respect to each other, and the one or more outlet openings 210 of the reservoir 110 may be blocked by a portion of the movable support 140, preventing paste from passing from the reservoir 110 to the receptacle 120. The closable passage may be in a closed state.

As further shown in FIG. 4, in the second position 450, the receptacle 120 may be arranged to be acted upon by the pusher 132 of the discharging mechanism 130. For example, the one or more inlet openings 220 of the receptacle 120 may face the pusher 132, e.g. a discharging rod.

Figure 5:
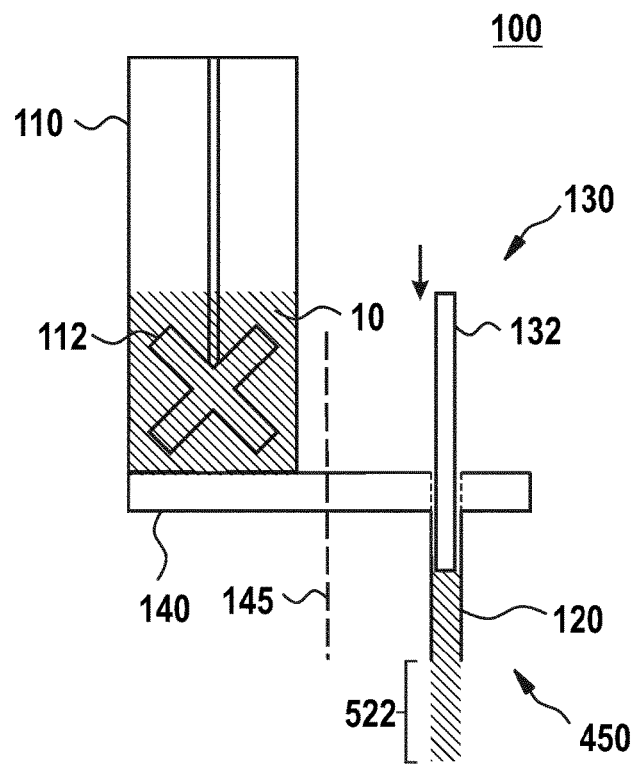
FIG. 5 shows a first discharging operation for discharging a first amount of paste by a paste dispensing apparatus according to embodiments described herein.

FIG. 5 illustrates a first discharging operation by the pusher 132 for discharging a first amount of paste 522 from the receptacle 120 while the receptacle is in the second position 450. The first discharging operation may include moving at least a portion of the pusher 132 (e.g. by an actuator connected to the pusher) into the receptacle to push the first amount of paste 522 out of the receptacle 120. The pusher 132 may have a width, or diameter, that fits into the receptacle 120. The first discharging operation may include moving at least a portion of the pusher 132 through the one or more inlet openings 220 of the receptacle 120. The one or more inlet openings 220 may be a single inlet opening through which at least a portion of the pusher 132 passes for performing the first discharging operation.

During the first discharging operation, or any other discharging operation as described herein, at least a portion of the pusher 132 (such as a bottom portion of the pusher being in contact with the paste in the receptacle 120) and at least a portion of the receptacle 120 (such as the one or more discharge openings 222) may be on a same side of the movable support 140 (bottom side of the movable support 140 in FIG. 5). The pusher may include one or more seals to seal off the paste in the receptacle during a paste discharging operation as described herein.

Figure 6:
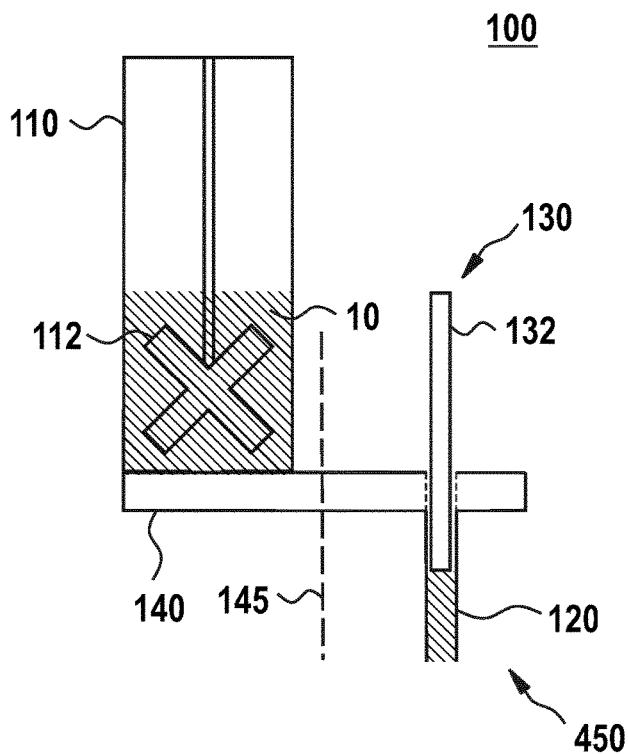
FIG. 6 shows a paste dispensing apparatus according to embodiments described herein after the first discharging operation.

FIG. 6 shows the paste dispensing apparatus 100 after the first amount of paste 522 has been discharged from the receptacle 120.

An amount of paste that is discharged from the receptacle 120 in a discharging operation (like the first amount of paste 522 being discharged in the first discharging operation, or any other amount of paste discharged in a discharging operation as described herein) can be understood as a dose of paste that is to be supplied by the paste dispensing apparatus 100 to a printer for performing printing, more specifically screen printing. A dose of paste may be an amount of paste having a mass of 500 g or less, particularly 400 g or less, such as about 300 g or about 150 g. A dose of paste can serve to perform a relatively small amount of printing strokes by the printer, such as 5000 printing strokes or less, particularly 4000 printing strokes or less, such as from 1000 to 4000 printing strokes. After said amount of printing strokes has been performed, a further dose of paste may be supplied to the printer by the paste dispensing apparatus for continuing the printing. A printing stroke can be understood as a movement of a squeegee or doctor blade from one end of a screen used for screen printing to the opposite end of the screen.

The receptacle 120 may be configured for containing one, or at most a few, doses of paste that are to be supplied to a printer (or to several printers). For example, a maximum number of doses that is containable by the receptacle may be N, wherein N is 5 or less, 4 or less, 3 or less, 2 or less or 1. In some embodiments, the receptacle may be configured to contain only a single dose of paste, so that N may be equal to 1. The first volume of paste 380 (and likewise the second volume as described herein) that is transferred from the reservoir 110 to the receptacle 120 may be an amount of paste having a volume of N doses of paste. The first volume and/or second volume may be equal to N times the volume of a single dose.

Figure 7:
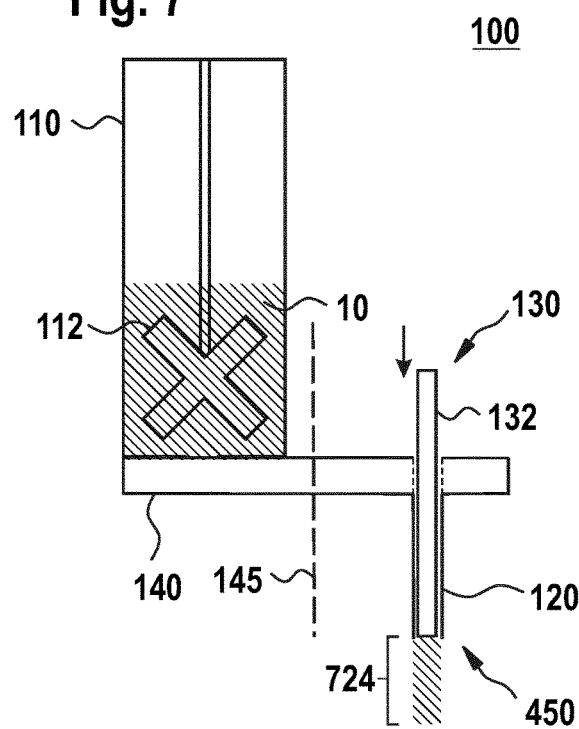
FIG. 7 shows a second discharging operation for discharging a second amount of paste by a paste dispensing apparatus according to embodiments described herein.

FIG. 7 shows the receptacle 120 in the second position 450, after the first amount of paste 522 has been discharged from the receptacle 120. A second amount of paste 724, or second dose, is discharged from the receptacle 120 by the pusher 132 in a second discharging operation. The second amount of paste 724 may be supplied to a printer. The second discharging operation may include performing a further movement of the pusher 132 (e.g. by an actuator connected to the pusher) in the receptacle 120.

In the example shown in FIG. 7, the receptacle 120 is substantially free of paste after the second discharging operation has been performed. The second discharging operation results in the receptacle being substantially empty.

A receptacle that is substantially free of paste, or substantially empty, can be understood in the sense that all paste has been removed from the receptacle except for possibly a small residual amount of paste, e.g. a small residual amount of paste that is not accessible for discharging by the pusher 132. Such a small residual amount may, for example, be a thin layer of paste that sticks to the walls of the receptacle or a small amount of paste that adheres to an end portion of the pusher 132. The term "substantially free of paste" can include a receptacle where a residual amount of paste is 10% or less, or even 5% or less, of a maximum amount of paste that can be contained in the receptacle.

In the example shown in FIGS. 5-7, the receptacle 120 is substantially free of paste after performing two discharging operations to discharge two respective doses of paste. The disclosure is not limited thereto. According to embodiments, N discharging operations may be performed to empty the receptacle 120, wherein N may be 5 or less, 4 or less, 3 or less, 2 or less, or 1.

In light of the above, the pusher 132 may be configured to perform one or more discharging operations so that, directly after the one or more discharging operations, the receptacle 120 is substantially free of paste. Substantially all paste contained in the receptacle 120 may be accessible to the pusher 132 for being discharged from the receptacle 120 (either in a single discharging operation or in multiple discharging operations). In comparison, in systems where a discharging mechanism is not capable of removing all paste from the receptacle, the residual paste left in the receptacle may be subject to unwanted changes in the rheological properties of the paste, e.g. hardening of the paste. Such residual amounts of paste result in paste of reduced quality being used for the printing. In addition, the screen of the printer may be clogged by such hardened residual amounts of paste.

Figure 8:
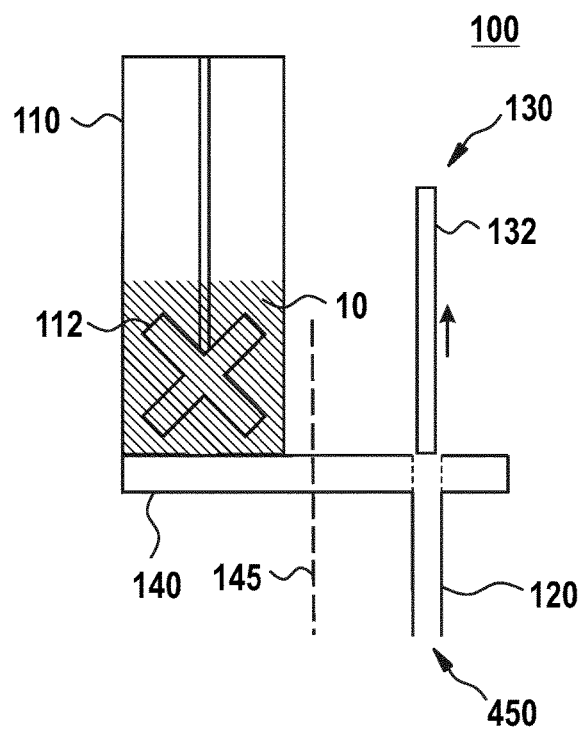
FIG. 8 shows a retraction of a discharging rod in a paste dispensing apparatus according to embodiments described herein.

As shown in FIG. 8, after the receptacle 120 has been substantially emptied by the discharging mechanism 130, the pusher 132 may be moved out of the substantially empty receptacle 120 (e.g. by an actuator connected to the pusher) while the receptacle 120 is in the second position 450. Thereafter, the empty receptacle 120 may be moved from the second position 450 back to the first position 350 for re-filling of the receptacle 120. The movement of the receptacle 120 from the second position 450 to the first position 350 may be performed by moving, e.g. rotating, the movable support 140. The movement may be performed by an actuator.

Figure 9:
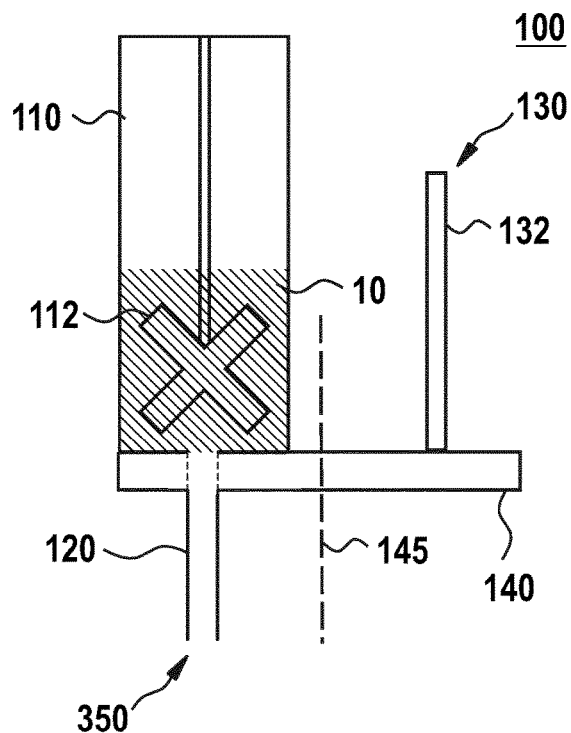
FIG. 9 shows a rotation of the receptacle from the second position to the first position in a paste dispensing apparatus according to embodiments described herein.
Figure 10:
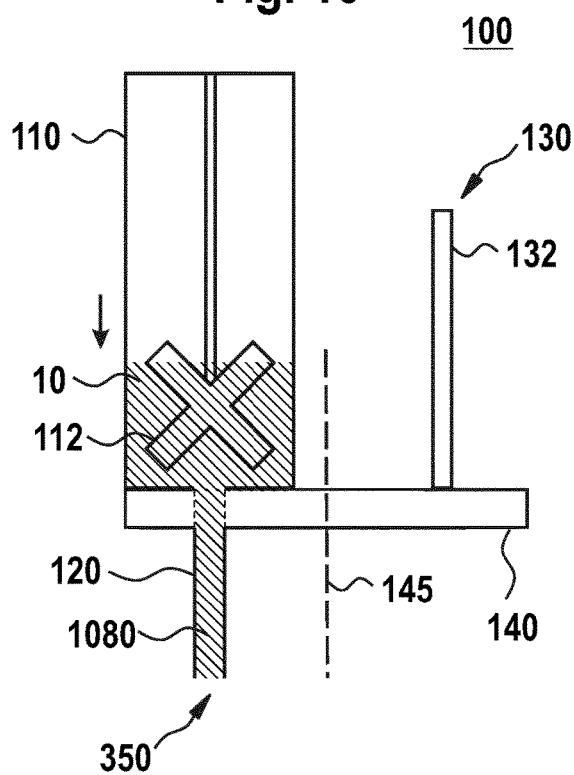
FIG. 10 shows a transfer of a second volume of paste from the reservoir to the receptacle of a paste dispensing apparatus according to embodiments described herein.

FIG. 9 shows the receptacle 120 back in the first position 350, so that the one or more outlet openings 210 of the reservoir 110 may be aligned with the one or more inlet openings 220 of the receptacle 120. The closable passage from the reservoir 110 to the receptacle 120 may be in the open state, allowing paste 10 to pass from the reservoir 110 to the receptacle 120. As shown in FIG. 10, a second volume of paste 1080 may be transferred from the reservoir 110 to the receptacle 120 while the receptacle 120 is in the first position 350. The second volume 1080 may be a similar amount of paste to the first volume of paste 380. The second volume of paste 1080 may be configured for filling the receptacle 120. In other embodiments, the second volume of paste may be a smaller volume, so that the receptacle may be not be filled by the second volume of paste. After the second volume of paste 1080 has been received by the receptacle 120 in the first position 350, the receptacle 120 may be moved from the first position 350 to the second position 450 by a movement, e.g., rotation, of the movable support 140 for discharging one or more amounts of paste from the receptacle, as described above.

The discharging mechanism 130 shown in FIGS. 1-10 operates by way of a pusher 132, namely a discharging rod, which advances into the receptacle to push paste out of the receptacle 120. The disclosure is not limited to a pusher 132 being a discharging rod. The discharging mechanism 130 may include a pusher that is not shaped as a rod or bar. The pusher may have any other shape suitable for pushing paste out of the receptacle. The shape of the pusher may depend on the shape of the receptacle, wherein the pusher may have a shape that matches the shape of the interior of the receptacle so that the pusher is capable of pushing substantially all paste out of the receptacle. A pusher may be or include a rod, bar, piston, or the like.

The movable support 140 shown in FIGS. 1-10 is a rotary support that rotates about a rotation axis 145 for moving the receptacle 120 between the first position 350 and the second position 450. The disclosure is not limited thereto. The movable support 140 may move the receptacle 120 between the first position 350 and the second position 450 in a different manner. For example, the movement of the receptacle 120 from the first position 350 to the second position 450 may be a linear movement. For example, the movable support 140 may include a sliding mechanism for sliding the receptacle 120 in a linear motion between the first position 350 and the second position 450.

In light of the above, a paste dispensing apparatus 100 according to embodiments described herein is operable in a manner such that the apparatus does not include regions ("dead zones") where the paste can be subject to unwanted changes in the rheological properties of the paste. In the reservoir 110, the paste 10 is stirred by the stirrer 112, thereby preventing a segregation of the components of the paste and ensuring that the rheological properties of the paste 10 are maintained in a desired state that is suitable for printing the paste. In the receptacle 120, the paste is not stirred. Nevertheless, the receptacle 110 has a small size for containing only a small number of doses of paste (such as up to 5 doses of paste), so that the paste does not stay in the receptacle for a long time. In light thereof, the rheological properties of the paste do not have the chance to change as compared to the conditions provided in the reservoir 110. Further, the discharging mechanism is operable to discharge substantially all paste from the receptacle (either in a single discharging operation or in a small number of discharging operations, such as up to 5 discharging operations) so that the receptacle is emptied, and only thereafter is the receptacle refilled with fresh paste. There is no residual amount of paste that stays in the receptacle for a longer period of time that would cause the paste to be subject to a substantial change in the rheological properties. In light thereof, it can be ensured that the paste which is dispensed by the paste dispensing apparatus 100 to a printer has rheological properties that are substantially the same as the properties of the paste in the reservoir, so that the dispensed paste is a high-quality, homogenous paste that allows a high-quality printing operation to be performed.

FIG. 11 shows a paste dispensing apparatus 100 for dispensing a paste 10 for a printer according to embodiments described herein. The paste dispensing apparatus 100 includes a reservoir 110 containing a paste 10 and a stirrer 112 for stirring the paste 10 in the reservoir 110. The paste dispensing apparatus 100 includes a receptacle 120 for receiving paste from the reservoir 110.

Different from the paste dispensing apparatus 100 shown in FIGS. 1-10, the receptacle 120 in FIG. 11 is not mounted to a movable support 140 for moving the receptacle between a first position 350 and a second position 450. The receptacle 120 may be a stationary receptacle. The receptacle 120 may be arranged to maintain a stationary relative position with respect to the reservoir 110. The receptacle may be mounted to, attached to, or even integrated with, the reservoir 110.

The receptacle 120 may have one or more inlet openings 1120 for receiving paste from the reservoir 110. The one or more inlet openings 1120 may be disposed inside the reservoir 110. The one or more inlet openings 1120 may be configured to provide a fluid coupling, or fluid communication, from the reservoir 110 to the receptacle 120. The receptacle may include one or more discharge openings 222 for discharging paste from the receptacle 120. The one or more inlet openings 1120 and the one or more discharge openings 222 may be disposed on opposite ends of the receptacle 120.

The paste dispensing apparatus 100 may include a discharging mechanism 130 including a pusher 132, e.g. a discharging rod or other kind of pusher. At least a portion of the pusher 132 may be disposed in the reservoir 110. For example, the stirrer 112 may have a hollow shaft, and at least a portion of the pusher 132 may be disposed in the hollow shaft.

The one or more inlet openings 1120 may provide a closable passage from the reservoir 110 to the receptacle 120. The closable passage may be in an open state or a closed state depending on a position of the pusher 132.

FIG. 11 shows the closable passage in a closed state. In the closed state of the closable passage, a portion 1130 of the pusher 132, e.g. a bottom portion, may be disposed inside the receptacle 120 in a manner such that the one or more inlet openings 1120 are blocked by the portion 1130. The one or more inlet openings 1120 may be closed. The portion 1130 blocking the one or more inlet openings 1120 prevents the paste 10 from passing from the reservoir 110 to the receptacle 120.

FIG. 12 shows the closable passage in an open state. The pusher 132 is retracted (upward movement in FIG. 12, indicated by the arrow) so that the one or more inlet openings 1120 are no longer blocked. The paste can pass from the reservoir 110 to the receptacle 120 via the one or more inlet openings 1120.

Figure 13:
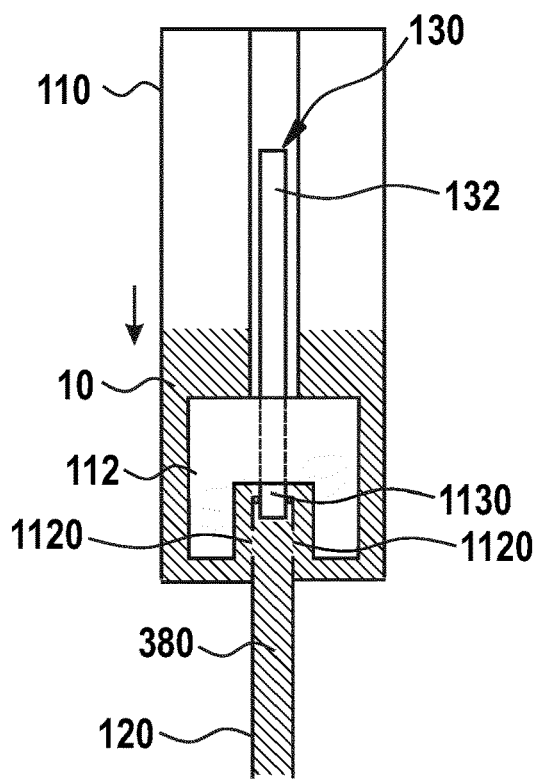
FIG. 13 shows a transfer of a first volume of paste from a reservoir to a receptacle of a paste dispensing apparatus according to embodiments described herein.

FIG. 13 shows a first volume of paste 380 being transferred from the reservoir 110 to the receptacle 120 via the one or more inlet openings 1120 while the pusher 132 is in the retracted position, i.e. while the closable passage is in the open state. The paste may be pushed out of the reservoir 110 by movement of a further pusher (not shown), e.g. a piston, in the reservoir 110. The first volume of paste 380 may be configured for filling the receptacle 120, as described above.

Figure 14:
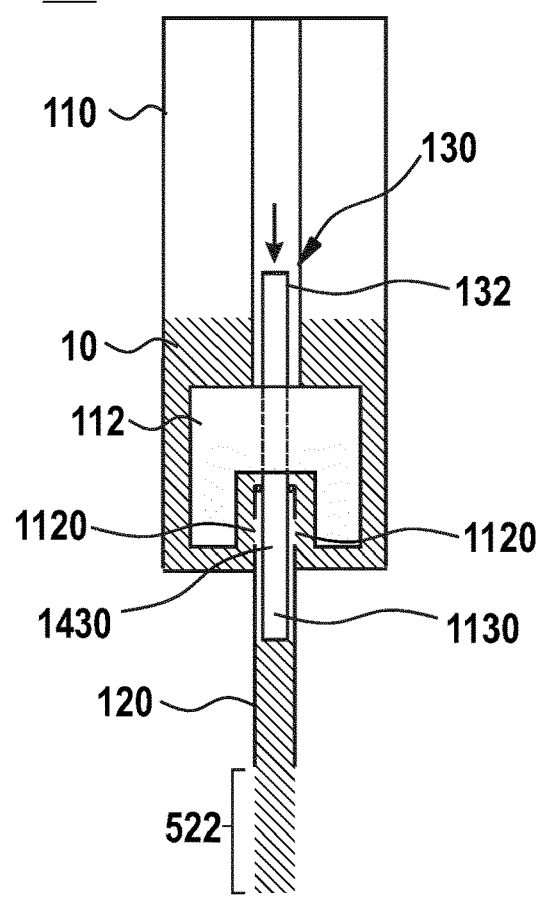
FIG. 14 shows a first discharging operation for discharging a first amount of paste by a paste dispensing apparatus according to embodiments described herein.

FIG. 14 shows a first discharging operation by the pusher 132 for discharging a first amount of paste 522 from the receptacle. Starting from the retracted position, the pusher 132 may advance in the receptacle 120 for pushing the first amount of paste 522 out of the receptacle 120. For example, an end portion at the bottom of the pusher 132 may push the paste out of the receptacle 120. During the first discharging operation, the pusher 132 may block the one or more inlet openings 1120 (see for example portion 1430 blocking the one or more inlet openings 1120 in FIG. 14), so that the closable passage is in the closed state during the first discharging operation. In light hereof, the discharging mechanism 130, more specifically the pusher 132, of the paste dispensing apparatus 100 shown in FIGS. 11-14 may have a double function, namely a first function that involves opening and closing the closable passage and a second function that involves discharging the paste.

After the first discharging operation shown in FIG. 14 has been performed, the pusher 132 may perform one or more further discharging operations (by advancing the pusher 132 further in the receptacle 120) to empty the receptacle 120. During the one or more further discharging operations, the pusher 132 may continue to block the one or more inlet openings 1120, so that the closable passage is maintained in the closed state during the one or more discharging operations. Alternatively, the receptacle 120 may be emptied in a single discharging operation. After the receptacle 120 has been emptied, the pusher 132 may be retracted again until the pusher 132 reaches the position shown in FIG. 12 to provide the closable passage back in the open state. Thereafter, the receptacle 120 may be filled with a second volume of paste, and so on.

In light of the above, the paste dispensing apparatus 100 of FIGS. 11-14 is also operable in a manner such that there are no dead zones where the paste can be subject to unwanted changes in the rheological properties of the paste. It can be ensured that the paste which is dispensed by the paste dispensing apparatus 100 is a high-quality, homogenous paste.

In light of the above, according to an embodiment, a method of dispensing paste for a printer using a paste dispensing apparatus is provided. The paste dispensing apparatus includes a reservoir for storing a paste for a printer. The reservoir includes a stirrer for stirring the paste. The paste dispensing apparatus includes a receptacle for receiving paste from the reservoir. The paste dispensing apparatus includes a closable passage from the reservoir to the receptacle. The closable passage is changeable between an open state and a closed state. In the open state, the receptacle is fluidly coupled to the reservoir so that paste can pass from the reservoir to the receptacle. In the closed state, the receptacle is fluidly decoupled from the reservoir so that the paste is prevented from passing from the reservoir to the receptacle. The paste dispensing apparatus includes a pusher for pushing paste out of the receptacle. The method includes transferring a first volume of paste from the reservoir to the receptacle while the closable passage is in the open state. The method includes, after the transferring, changing the closable passage from the open state to the closed state. The method includes, after the changing, performing a first discharging operation by the pusher to discharge a first amount of paste from the receptacle while the closable passage is in the closed state.

The paste dispensing apparatus may include a discharging mechanism for discharging the paste from the receptacle. The discharging mechanism may include the pusher.

The paste dispensing apparatus may include an actuator or set of actuators connected to the pusher. The actuator or set of actuators may be configured to move the pusher to push paste out of the receptacle. The actuator or set of actuators may be included in the discharging mechanism.

The paste dispensing apparatus may include one or more closable openings providing, or forming part of, the closable passage from the reservoir to the receptacle. In the open state of the closable passage, the one or more closable openings may be open. In the closed state of the closable passage, the one or more closable openings may be closed. An opening that is open can be understood in the sense that paste can pass through the opening, in other words that the opening is not blocked. A closed opening can be understood as an opening that is blocked, so that paste cannot move through the opening. For example, in the apparatus shown in FIGS. 1-10, the one or more closable openings can refer to the one or more outlet openings 210 of the reservoir 110. In the apparatus shown in FIGS. 11-14, the one or more closable openings can refer to the one or more inlet openings 1120.

The paste dispensing apparatus may include a movable shutter portion or a set of movable shutter portions for opening and closing the one or more closable openings. The movable shutter portion or set of movable shutter portions may be movable between a first position and a second position. In the first position of the movable shutter portion or set of movable shutter portions, the one or more closable openings may be open. In the second position of the movable shutter portion or set of movable shutter portions, the movable shutter portion or set of movable shutter portions may block the one or more closable openings so that the one or more closable openings are closed. For example, in the apparatus shown in FIGS. 1-10, the movable shutter portion may refer to the portion of the movable support 140 that blocks the one or more outlet openings 210 of the reservoir 110 in the second position 450 of the receptacle 120. In the apparatus shown in FIGS. 11-14, the movable shutter portion may refer to a portion or portions of the pusher 132 that is/are configured to block the one or more inlet openings 1120.

The receptacle and the reservoir may be two separate entities, as shown for example in FIGS. 1-10. Alternatively, the receptacle and the reservoir may be attached to each other or may even be integrated together, i.e. the receptacle and the reservoir may be two portions of a common entity, as shown for example in FIGS. 11-14.

A paste as described herein may be a paste for printing on a solar cell or a substrate used for the manufacture of a solar cell.

In the open state of the closable passage (for example, in the configuration shown in FIG. 3 or the configuration shown in FIG. 13), the receptacle may be adjacent to the reservoir so that the paste can pass directly from the reservoir to the receptacle. In some embodiments, such as the apparatus shown in FIGS. 1-10, the receptacle may be movable between a first position providing the open state of the closable passage and a second position providing the closed state of the closable passage. In the second position, the receptacle, or at least the one or more inlet openings 220 of the receptacle, may be spaced apart from the reservoir. In other embodiments, such as the apparatus shown in FIGS. 11-14, the receptacle may be stationary with respect to the reservoir, and the receptacle may be adjacent to the reservoir both in the open state and in the closed state of the closable passage.

A method according to embodiments described herein may include performing one or more discharging operations by the pusher to discharge one or more respective amounts of paste from the receptacle while the closable passage is in the closed state. The one or more discharging operations may include or consist of the first discharging operation. The closable passage may be maintained in the closed state from an initial discharging operation of the one or more discharging operations to a final discharging operation of the one or more discharging operations. The final discharging operation may be different from or equal to the initial discharging operation. The initial discharging operation may be the first discharging operation as described herein.

The one or more discharging operations may be a single discharging operation to discharge a single amount of paste from the receptacle or N discharging operations for discharging N respective amounts of paste from the receptacle. The number N may be 2 or more. The number N may be 5 or less.

The receptacle may be substantially free of paste after, particularly directly after, the one or more discharging operations have been performed. The one or more discharging operations may be performed to discharge substantially all paste from the receptacle.

A method according to embodiments described herein may include changing the closable passage from the closed state to the open state after the performing of the first discharging operation as described herein and/or after the performing of the one or more discharging operations as described herein. The changing from the closed state to the open state may be performed while the receptacle is substantially free of paste.

The method may include transferring a second volume of paste from the reservoir to the receptacle while the closable passage is in the open state. The transferring of the second volume may be performed after the performing of the first discharging operation, after the performing of the one or more discharging operations and/or after the changing of the closable passage from the closed state to the open state. At a time when the transferring of the second volume of paste is started, the receptacle may be substantially free of paste.

A receptacle as described herein may include one or more inlet openings for receiving paste from the reservoir. The receptacle may include one or more discharge openings for discharging paste from the receptacle. The receptacle may include a tubular channel, such as a pipe. The one or more inlet openings and the one or more discharge openings may be on opposite ends of the tubular channel.

A pusher as described herein may be configured to translate in a first direction for pushing paste out of the receptacle. The translation may be provided by the actuator or set of actuators connected to the pusher. The first direction may be a length direction of the receptacle. A method according to embodiments described herein may include translating the pusher in the first direction for pushing paste out of the receptacle.

A receptacle as described herein may be movable with respect to the reservoir and/or the pusher between a first position and a second position. The second position may be spaced apart from the first position.

The receptacle may be in the first position for a first period of time. During at least a portion of the first period of time, the closable passage may be in the open state. The receptacle may be in the second position for a second period of time. During at least a portion of the second period of time, the closable passage may be in the closed state.

The transferring of the first volume of paste from the reservoir to the receptacle in the open position of the closable passage may be performed while the receptacle is in the first position. A method according to embodiments described herein may include moving the receptacle from the first position to the second position after the transferring of the first volume of paste from the reservoir to the receptacle. The first discharging operation to discharge the first amount of paste from the receptacle in the closed state of the closable passage may be performed while the receptacle is in the second position.

The reservoir may include one or more outlet openings for feeding paste to the receptacle. The receptacle may include one or more inlet openings for receiving paste from the reservoir. The one or more outlet openings and the one or more inlet openings may form, or at least form part of, the closable passage. In the first position of the receptacle, the one or more inlet openings may be aligned with the one or more outlet openings so that paste can pass from the reservoir to the receptacle through the one or more outlet openings and through the one or more inlet openings. In the second position of the receptacle, the one or more inlet openings may be offset from the one or more outlet openings so that paste is prevented from passing from the reservoir to the receptacle.

The receptacle may be mounted to a movable support. The receptacle may be moved from the first position to the second position by moving the movable support. The movable support may be a rotary support. The receptacle may be moved from the first position to the second position by moving the movable support over an angle.

In the first position of the receptacle, the receptacle mounted to the movable support, e.g. rotary support, may be arranged for receiving paste from the reservoir. In the second position, a portion of the movable support may close off the one or more outlet openings of the reservoir.

In the first position, the pusher and the receptacle may be on opposite sides of the movable support, e.g. a rotary support. The pusher may be on a first side of the movable support. The receptacle may be on a second side of the movable support. The first side may be opposite the second side. In the second position, the receptacle may be arranged to be acted upon by the pusher. In the second position, at least a portion of the pusher may move from the first side of the movable support to the second side of the movable support into the receptacle, for example to perform a first discharging operation as described herein. The pusher may be configured to move through a portion of the movable support and into the receptacle.

FIGS. 15-17 show a system for processing a solar cell or a substrate used for the manufacture of a solar cell. The system includes a paste dispensing apparatus 100 according to embodiments described herein. The system includes a printer 1500. The printer 1500 may be a printer for screen printing. The printer 1500 may be configured for printing one or more features, such as a pattern of features, on a substrate 1550. The substrate 1550 may be a semiconductor substrate, such as a silicon substrate. The substrate may be a substrate used for the manufacture of an electronic device.

The substrate 1550 may be a solar cell or a substrate used for the manufacture of a solar cell. The printer 1500 may include a screen 1520, such as a mesh screen or a stencil. The printer 1500 may include a print head 1510. The print head 1510 may be movable over the screen for performing a printing stroke. The print head 1510 may include a pressure application instrument 1512, such as a squeegee or doctor blade. The pressure application instrument 1512 may be operable to apply a pressure to the screen 1520 for transferring a printing paste from the screen 1520 to the substrate 1550 disposed below the screen 1520.

FIG. 15 shows the print head 1510 on the left end of the screen 1520, before the printing has started.

FIG. 16 shows a first amount of paste 522, as described herein, provided on the screen 1520 by the paste dispensing apparatus 100. The first amount of paste 522 may be dispensed by performing a method according to embodiments described herein. The first amount of paste 522 may be deposed in front of the pressure application instrument 1512.

FIG. 17 shows the printer 1500 during a printing stroke. The print head 1510 including the pressure application instrument 1512 moves from the left end to the right end of the screen 1520 while exerting a pressure to the screen 1520 to urge at least a portion of the first amount of paste 522 through the screen 1520. One or more features 1710 may be printed on the substrate 1550.

A method according to embodiments described herein may include supplying the first amount of paste to a printer. The discharging of the first amount of paste from the receptacle, as described herein, may include discharging the first amount of paste from the receptacle to the printer. The printer may be a screen printer. The printer may be a printer for printing on a semiconductor substrate, such as a silicon substrate. The printer may be a printer for printing on a solar cell or a substrate used for the manufacture of a solar cell. The method may include printing one or more features on the semiconductor substrate, on the solar cell, and/or on the substrate used for the manufacture of a solar cell, using the first amount of paste.

Figure 18:
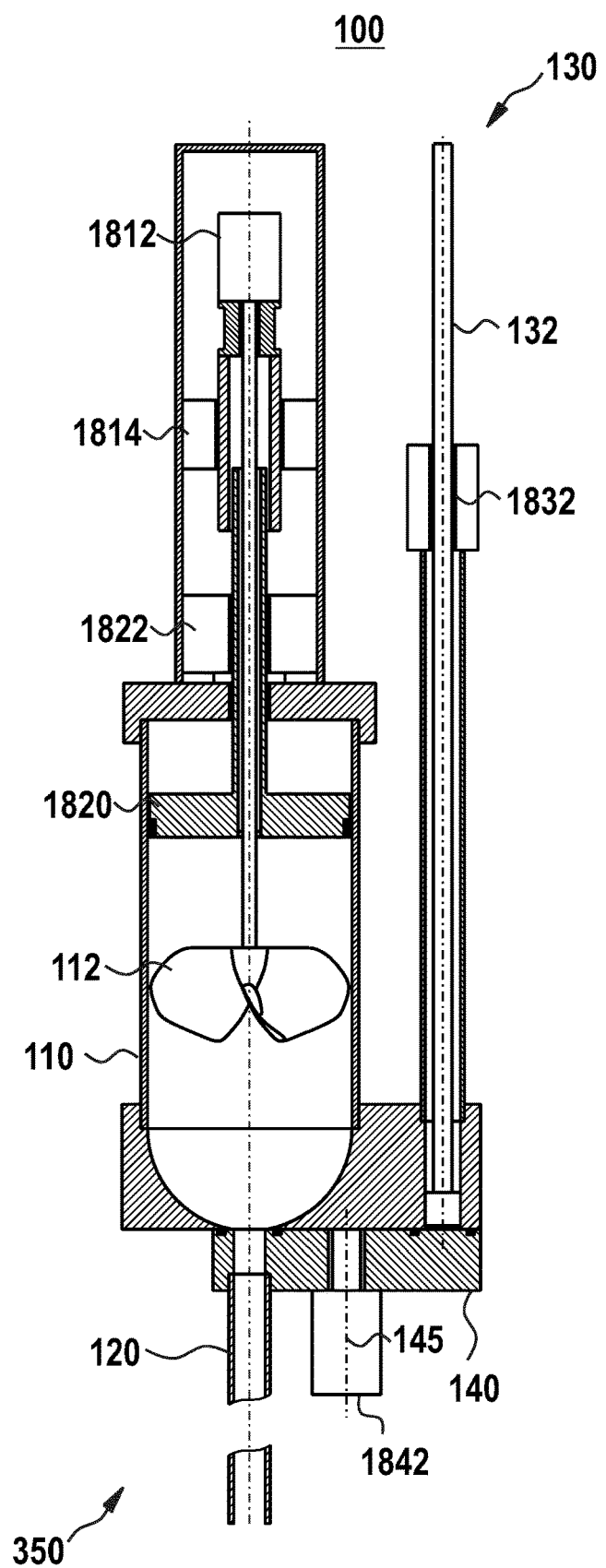
FIG. 18 shows a paste dispensing apparatus for dispensing a paste for a printer according to embodiments described herein.

FIG. 18 shows a paste dispensing apparatus 100 for dispensing a paste 10 for a printer according to embodiments described herein. The paste dispensing apparatus 100 may include a reservoir 110 including a stirrer 112, a receptacle 120 mounted or mountable to a movable support 140 and a discharging mechanism 130 including a pusher 132, similar to the paste dispensing apparatus 100 shown in FIGS. 1-10. The movable support 140 shown in FIG. 18 is a rotary support.

The paste dispensing apparatus 100 may include a first actuator or first set of actuators 1812 connected to the stirrer 112 for rotating the stirrer 112. The first actuator or first set of actuators 1812 may include one or more motors, such as one or more torque motors.

The paste dispensing apparatus 100 may include a second actuator or second set of actuators 1814 connected to the stirrer 112 to provide a linear motion of the stirrer 112, e.g. for advancing the stirrer 112 towards a bottom portion of the reservoir 110. The second actuator or second set of actuators 1814 may include a torque motor or servomotor coupled to a linear screw mechanism for providing the linear motion of the stirrer 112 (or a set of such torque motors or servomotors), a pneumatic actuator coupled with a pneumatic valve for providing the linear motion of the stirrer 112 (or a set of such pneumatic actuators), or the like.

The paste dispensing apparatus 100 may include a pusher 1820, e.g. a piston, in the reservoir 110 for pushing the paste out of the reservoir 110. The paste dispensing apparatus 100 may include a third actuator or third set of actuators 1822 connected to the pusher 1820 for providing a linear motion of the pusher 1820, e.g. for advancing the pusher 1820 in the reservoir 110 to push the paste out of the reservoir. The third actuator or third set of actuators 1822 may include a torque motor or servomotor coupled to a linear screw mechanism for providing the linear motion of the pusher 1820 (or a set of such torque motors or servomotors), a pneumatic actuator coupled with a pneumatic valve for providing the linear motion of the pusher 1820 (or a set of such pneumatic actuators), and the like. The third actuator or third set of actuators 1822 may be omitted and the linear motion of the pusher 1820 may be performed manually.

The paste dispensing apparatus 100 may include a fourth actuator or fourth set of actuators 1832 connected to the pusher 132 to provide a linear motion of the pusher 132, e.g. for providing a discharging operation as described herein. The fourth actuator or fourth set of actuators 1832 may include a torque motor or servomotor coupled to a linear screw mechanism for providing the linear motion of the pusher 132 (or a set of such torque motors or servomotors), a pneumatic actuator coupled with a pneumatic valve for providing the linear motion of the pusher 132 (or a set of such pneumatic actuators), and the like. The fourth actuator or fourth set of actuators 1832 may be omitted and the linear motion of the pusher 132 may be performed manually.

The paste dispensing apparatus 100 may include a fifth actuator or fifth set of actuators 1842 connected to the rotary support for rotating the rotary support, e.g. for moving between the first position of the receptacle and the second position of the receptacle as described herein. The fifth actuator or fifth set of actuators 1842 may include one or more motors, such as one or more torque motors.

Any single feature, or any combination of features, of the paste dispensing apparatus 100 shown in FIG. 18 may be included in the paste dispensing apparatus 100 shown in FIGS. 1-10. The pusher 1820, the actuator associated with the pusher 1820 and the actuators associated with the stirrer 112 may also be included, as single features or in any combination, in the paste dispensing apparatus 100 shown in FIGS. 11-14.

Figure 19:
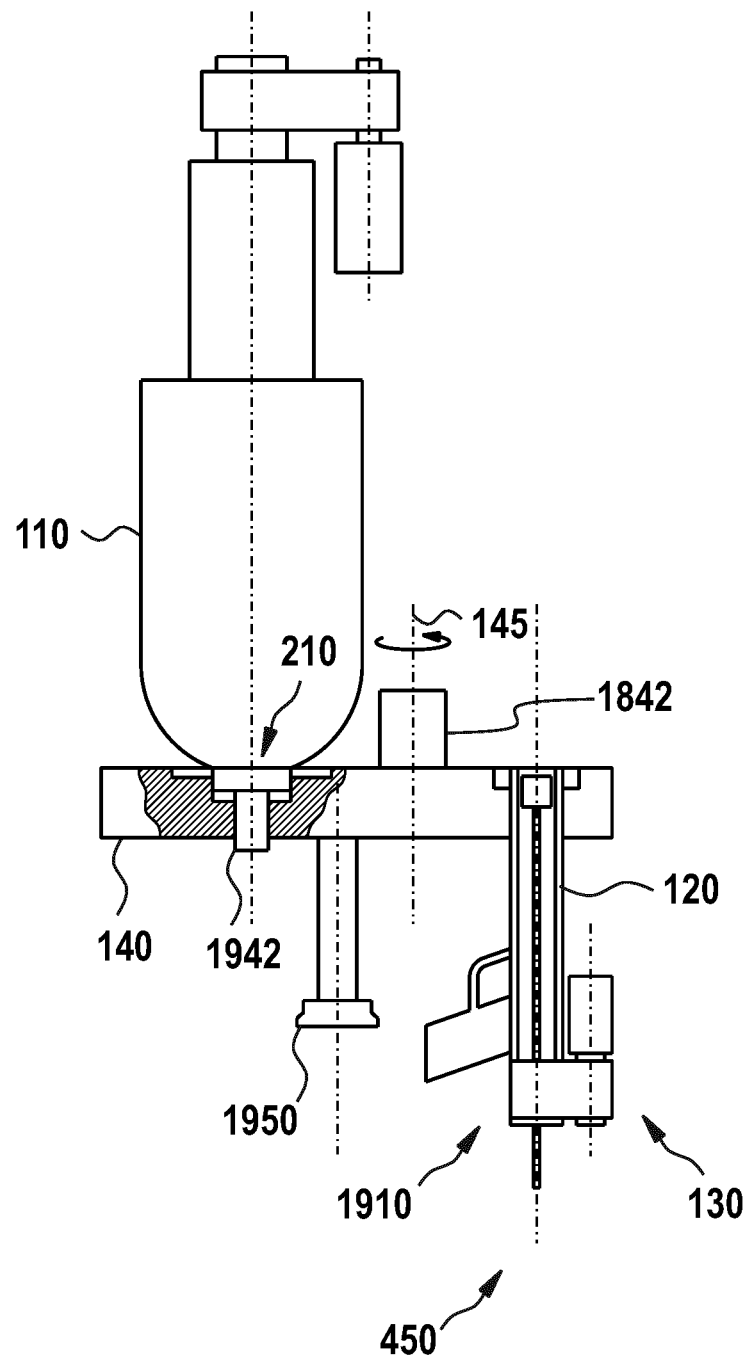
FIG. 19 shows a paste dispensing apparatus for dispensing a paste for a printer according to embodiments described herein.

FIG. 19 shows a paste dispensing apparatus 100 for dispensing a paste for a printer according to embodiments described herein. The paste dispensing apparatus 100 may include a reservoir 110 including a stirrer (not shown in FIG. 19) as described herein. The paste dispensing apparatus 100 may include a receptacle 120 and/or a discharging mechanism 130 including a pusher 132 (not shown in FIG. 19) as described herein.

In some embodiments, as shown in FIG. 19, the receptacle 120 may be part of a paste dispensing gun 1910. The pusher 132, more generally the discharging mechanism 130, may be part of the paste dispensing gun 1910. The paste dispensing gun 1910 may include both the receptacle 120 and the pusher 132. The paste dispensing apparatus 100 may include a movable support 140, e.g. a rotary support, as described herein. The paste dispensing gun 1910 may be mountable, particularly detachably mountable, to the movable support 140. When mounted to the movable support 140, the paste dispensing gun 1910 (including the receptacle 120 and the pusher 132) may be movable between the first position 350 and the second position 450 by a movement, e.g., a rotation, of the movable support 140 for opening and closing the closable passage between the reservoir 110 and the receptacle 120, similar to what was described above for FIGS. 1-10. FIG. 19 shows the paste dispensing gun 1910 in the second position 450. In the first position 350, the paste dispensing gun 1910 may be arranged such that the receptacle 120 can receive paste from the reservoir 110 (open state of the closable passage). In the second position 450, the paste dispensing gun 1910 may be spaced apart from the reservoir 110, and a portion of the movable support 140, e.g. a closing plug 1942, may close the one or more outlet openings 210 of the reservoir 110 (closed state of the closable passage). After moving the paste dispensing gun 1910 having a receptacle 120 filled with paste from the first position to the second position, the paste dispensing gun 1910 may be detached from the movable support 140. The paste dispensing gun 1910 may then be moved to a printer and the pusher 132 of the paste dispensing gun 1910 may be used to perform one or more discharging operations for supplying paste to the printer, as described herein. The one or more discharging operations performed by the paste dispensing gun 1910 may be performed while the movable support 140 is maintained in the second position 450, i.e. while the closable passage is in the closed state. When the paste dispensing gun 1910 is empty, the paste dispensing gun 1910 may be connected again to the movable support 140, the movable support 140 may be moved from the second position 450 to the first position 350 for opening the closable passage, and the receptacle 120 of the paste dispensing gun 1910 may be refilled while the movable support 140 is in the first position 350.

In the paste dispensing apparatus 100 of FIG. 19, the reservoir 110 and/or movable support 140, e.g. rotary support, may form, or be part of, a stationary terminal. When a paste dispensing gun 1910 is to be recharged with paste, the paste dispensing gun 1910 may be temporarily connected to the stationary terminal for recharging, and thereafter disconnected again for supplying paste to the printer.

A movable support 140, e.g. a rotary support, of a paste dispensing apparatus 100 according to embodiments described herein may include a reservoir filling port 1950. The reservoir filling port 1950 may be adapted for connecting a container to the movable support 140. The container may include paste for replenishing the reservoir 110. The movable support 140 may be moveable into a first position 350 as described herein, a second position 450 as described herein, and a third position. In the third position, the reservoir filling port 1950 may face the one or more outlet openings 210 of the reservoir 110. In the third position, the reservoir filling port 1950 may be fluidly coupled to the reservoir 110, for example to the one or more outlet openings 210 of the reservoir 110, for feeding paste from the container to the reservoir 110 via the reservoir filling port 1950, e.g. to replenish the reservoir 110. In light thereof, the movable support 140 may be movable between at least three positions, namely a first position for filling the receptacle 120, a second position for closing the closable passage and a third position for filling the reservoir 110.

The aspects described above relating to the reservoir filling port 1950 may also be included, in any combination, in the paste dispensing apparatus 100 shown in FIGS. 1-10 and 18.

According to a further embodiment, a paste dispensing apparatus for dispensing paste for a printer is provided. The paste dispensing apparatus includes a reservoir for storing a paste for a printer. The reservoir includes a stirrer for stirring the paste. The paste dispensing apparatus includes a receptacle for receiving paste from the reservoir. The paste dispensing apparatus includes a closable passage from the reservoir to the receptacle. The closable passage is changeable between an open state and a closed state. In the open state, the receptacle is fluidly coupled to the reservoir so that the paste can pass from the reservoir to the receptacle. In the closed state, the receptacle is fluidly decoupled from the reservoir so that the paste is prevented from passing from the reservoir to the receptacle. The paste dispensing apparatus includes a pusher for discharging paste from the receptacle. The paste dispensing apparatus is configured to perform a first discharging operation by the pusher to discharge a first amount of paste from the receptacle while the closable passage is in the closed state. The paste dispensing apparatus may be configured for performing any aspect or combination of aspects of the method according to embodiments described herein.

A paste dispensing apparatus according to embodiments described herein may be configured for transferring a first volume of paste from the reservoir to the receptacle while the closable passage is in the open state. The paste dispensing apparatus may be configured for changing the closable passage from the open state to the closed state after the transferring of the first volume of paste. The paste dispensing apparatus may be configured to perform the first discharging operation after changing the closable passage from the open state to the closed state.

A paste dispensing apparatus according to embodiments described herein may be configured for performing one or more discharging operations by the pusher to discharge one or more respective amounts of paste from the receptacle while the closable passage is in the closed state. The one or more discharging operations may include or consist of the first discharging operation as described herein. The paste dispensing apparatus may be configured for maintaining the closable passage in the closed state from an initial discharging operation of the one or more discharging operations to a final discharging operation of the one or more discharging operations, as described herein. The receptacle may be substantially free of paste after, particularly directly after, the one or more discharging operations have been performed. The one or more discharging operations may be performed to discharge substantially all paste from the receptacle.

A paste dispensing apparatus according to embodiments described herein may be configured for changing the closable passage from the closed state to the open state after the performing of the first discharging operation as described herein. The apparatus may be configured for changing the closable passage from the closed state to the open state after the performing of the one or more discharging operations as described herein. The changing from the closed state to the open state may be performed while the receptacle is substantially free of paste.

A paste dispensing apparatus according to embodiments described herein may be configured for transferring a second volume of paste from the reservoir to the receptacle while the closable passage is in the open state. The transferring of the second volume may be performed after the performing of the first discharging operation, after the performing of the one or more discharging operations and/or after the changing of the closable passage from the closed state to the open state. When the transferring of the second volume of paste is started, the receptacle may be substantially free of paste.

A paste dispensing apparatus according to embodiments described herein may be an apparatus for supplying paste to a printer. The printer may be a screen printer. The printer may be a printer for printing on a solar cell or a substrate used for the manufacture of a solar cell.

The receptacle may be movable with respect to the reservoir between a first position and a second position as described herein. In the first position, the receptacle may be arranged for receiving paste from the reservoir. In the second position, the receptacle may be arranged to be acted upon by the discharging mechanism. The receptacle may be mounted or mountable to a movable support, particularly a rotary support. The movable support may be movable to move the receptacle from the first position to the second position. A movable support being a rotary support may be movable over an angle to move the receptacle from the first position to the second position.

According to a further embodiment, a paste dispensing apparatus for dispensing a paste for a printer is provided. The paste dispensing apparatus includes a reservoir including a stirrer. The paste dispensing apparatus includes a receptacle. The paste dispensing apparatus includes a pusher. The receptacle is movable with respect to the reservoir, particularly with respect to both the reservoir and the pusher, between a first position and a second position. In the first position, the receptacle is fluidly coupled or couplable to the reservoir. In the second position, the receptacle is arranged to be acted upon by the pusher. The paste dispensing apparatus may include any feature or feature combination of a paste dispensing apparatus according to embodiments described herein. The paste dispensing apparatus may be configured for performing any aspect or combination of aspects of the method according to embodiments described herein.

According to a further embodiment, a system for processing a solar cell or a substrate used for the manufacture of a solar cell is provided. The system includes a paste dispensing apparatus for dispensing a paste for a printer according to embodiments described herein. The system includes the printer. The printer may be a screen printer.

While the foregoing is directed to embodiments of the disclosure, other and further embodiments of the disclosure may be devised without departing from the basic scope thereof, and the scope thereof is determined by the claims that follow.

The invention claimed is:

1. A method of dispensing paste for a printer using a paste dispensing apparatus, the paste dispensing apparatus comprising:
a reservoir for storing a paste for a printer, the reservoir including a stirrer for stirring the paste;
a receptacle for receiving paste from the reservoir;
a closable passage from the reservoir to the receptacle, the closable passage being changeable between an open state and a closed state, wherein in the open state the receptacle is fluidly coupled to the reservoir so that the paste can pass from the reservoir to the receptacle, and in the closed state the receptacle is fluidly decoupled from the reservoir so that the paste is prevented from passing from the reservoir to the receptacle; and a pusher for pushing paste out of the receptacle;
the method comprising, in the following order:
transferring a first volume of paste from the reservoir to the receptacle while the closable passage is in the open state;
changing the closable passage from the open state to the closed state; and
performing a first discharging operation by the pusher to discharge a first amount of paste from the receptacle while the closable passage is in the closed state.

2. The method of claim 1, wherein the paste is a paste for printing on a solar cell or a substrate used for the manufacture of a solar cell.

3. The method of claim 1, further comprising:
while the closable passage is in the closed state, performing one or more discharging operations by the pusher to discharge one or more respective amounts of paste from the receptacle in a manner such that the receptacle is substantially free of paste after the one or more discharging operations have been performed, the one or more discharging operations including or consisting of the first discharging operation.

4. The method of claim 3, wherein the one or more discharging operations are a single discharging operation to discharge a single amount of paste from the receptacle or N discharging operations to discharge N respective amounts of paste from the receptacle, N being 5 or less.

5. The method of claim 3, further comprising, after the performing of the one or more discharging operations:
changing the closable passage from the closed state to the open state; and
transferring a second volume of paste from the reservoir to the receptacle while the closable passage is in the open state.

6. The method of claim 1, further comprising:
supplying the first amount of paste to the printer.

7. The method of claim 1, wherein: in the open state of the closable passage, the receptacle is adjacent to the reservoir so that the paste can pass directly from the reservoir to the receptacle.

8. The method of claim 1, wherein the receptacle is movable with respect to the reservoir between a first position and a second position, wherein:
the transferring of the first volume of paste from the reservoir to the receptacle in the open state of the closable passage is performed while the receptacle is in the first position,
the method further comprises moving the receptacle from the first position to the second position after the transferring of the first volume of paste from the reservoir to the receptacle, and
the first discharging operation to discharge the first amount of paste from the receptacle in the closed state of the closable passage is performed while the receptacle is in the second position.

9. The method of claim 8, wherein the reservoir includes one or more outlet openings for feeding paste to the receptacle and the receptacle includes one or more inlet openings for receiving paste from the reservoir, the one or more outlet openings and the one or more inlet openings forming part of the closable passage, wherein:
in the first position of the receptacle, the one or more inlet openings are aligned with the one or more outlet openings so that paste can pass from the reservoir to the receptacle through the one or more outlet openings and through the one or more inlet openings; and/or
in the second position of the receptacle, the one or more inlet openings are offset from the one or more outlet openings.

10. The method of claim 8, wherein the receptacle is mounted to a rotary support, wherein moving the receptacle from the first position to the second position includes moving the rotary support over an angle.

11. A paste dispensing apparatus for dispensing paste for a printer, comprising:
a reservoir for storing a paste for a printer,
the reservoir including a stirrer for stirring the paste;
a receptacle for receiving paste from the reservoir;
a closable passage from the reservoir to the receptacle, the closable passage being changeable between an open state and a closed state, wherein in the open state the receptacle is fluidly coupled to the reservoir so that the paste can pass from the reservoir to the receptacle, and in the closed state the receptacle is fluidly decoupled from the reservoir so that the paste is prevented from passing from the reservoir to the receptacle; and a pusher for discharging paste from the receptacle, the paste dispensing apparatus being configured to perform a first discharging operation by the pusher to discharge a first amount of paste from the receptacle while the closable passage is in the closed state.

12. The paste dispensing apparatus of claim 11, wherein the receptacle includes one or more inlet openings for receiving paste from the reservoir and one or more discharge openings for discharging paste from the receptacle.

13. The paste dispensing apparatus of claim 11,
wherein:
in the open state of the closable passage, the receptacle is adjacent to the reservoir so that the paste can pass directly from the reservoir to the receptacle.

14. The paste dispensing apparatus of any of claims 11 to 13, wherein the receptacle is movable with respect to the reservoir between a first position and a second position, wherein:
in the first position, the receptacle is arranged for receiving paste from the reservoir; and
in the second position, the receptacle is arranged to be acted upon by the pusher.

15. The paste dispensing apparatus of claim 14, wherein the receptacle is mounted or mountable to a rotary support, the rotary support being movable over an angle to move the receptacle from the first position to the second position.

\* \* \* \* \*